United States Patent [19]

Ahamed

[11] 4,312,069
[45] Jan. 19, 1982

[54] SERIAL ENCODING-DECODING FOR CYCLIC BLOCK CODES

[75] Inventor: Syed V. Ahamed, Gillette, N.J.

[73] Assignee: Bell Telephone Laboratories, Incorporated, Murray Hill, N.J.

[21] Appl. No.: 119,420

[22] Filed: Feb. 7, 1980

[51] Int. Cl.³ .......................................... G06F 11/10
[52] U.S. Cl. ...................................................... 371/37
[58] Field of Search .................................. 371/37, 42

[56] References Cited

U.S. PATENT DOCUMENTS

| | | | |
|---|---|---|---|
| 3,568,148 | 2/1971 | Clark, Jr. | 371/37 |
| 3,774,153 | 11/1973 | Ahamed | 371/37 |
| 3,944,973 | 3/1976 | Masson | 371/37 |
| 3,983,536 | 9/1976 | Telfer | 371/37 |

OTHER PUBLICATIONS

Ahamed, "The Design & Embodiment of Magnetic Domain Encoders & Single-Error Correcting Decoders for Cyclic Block Codes", *The Bell System Technical Journal*, vol. 51, No. 2, Feb. 1972, pp. 461–485.

Cummins, "Displacement Calculation of Error Correcting Syndrome Bytes by Table Lookup", *IBM Technical Disclosure Bulletin*, vol. 22, No. 8B, Jan. 1980, pp. 3809–3810.

*Primary Examiner*—David H. Malzahn
*Attorney, Agent, or Firm*—R. O. Nimtz

[57] ABSTRACT

Means for serially encoding and decoding cyclic block codes having minimal parity check bits and single error correcting capability are disclosed.

Encoder (12) comprises: serial shift and divide means (4100, 4150, 4200, SA, S3, S4 and S5) for generating parity check bits to append to the data word and thereby form the channel word; input buffer (4300) for storing bits of the next channel word during evaluation of the parity bits of the previous word; and output buffer registers (4400 through 4800) for storing bits of the channel word for eventual transmission. Certain registers (4400 through 4800) are partitioned into a parallel arrangement of register segments of predetermined lengths so as to effect full loading of each segmented register prior to the request for transmission from each register.

Decoder (20) comprises: means (5100, 5200, 5030, SA1, SB1, or 6100, 6200, 6030, SA2, SB2) for shifting and dividing the received word to generate the syndrome as well as iteratively shifted versions of the syndrome; means (5300,5031 or 6300,6301), alternating operation with the shifting and dividing means, for comparing the characteristic polynomial (5300) of the code with the iteratively shifted versions of the syndrome; and means (5020, 5021, 5022 and 5400 or 6400) for correcting, in response to a predetermined output from the comparing means, the received word by inverting the bit in the received word depending on the number of iterations performed in generating the iteratively shifted versions of the abstract. The decoder comprises two substantially identical sections each having two modes of operations. The sections alternate modes of operation so that two contiguous blocks are processed during a given interval.

15 Claims, 6 Drawing Figures

SERIAL ENCODING-DECODING FOR CYCLIC BLOCK CODES

BACKGROUND OF THE INVENTION

1. Field of the Invention

This invention relates generally to encoders and decoders for cyclic block codes of the Bose-Chaudhuri-Hocquenghem (BCH) type and, more particularly, to serial encoders and decoders with single error correcting capability.

2. Description of the Prior Art

Most of the prior art relating to BCH-type encoders and decoders concentrate on binary division techniques for generating the parity check bits at the encoder, and the syndrome, as well as shifted versions thereof, at the decoder. Largely ignored in the prior art are the necessary logical functions needed to maintain synchronism between bits of the code word generated at the encoder and the corresponding synchronizing functions required at the decoder to process the sequentially received data blocks.

Prior to 1972, binary division was typically accomplished by distributing a series of exclusive OR gates along a shift register cascade. With this arrangement, division at the encoder utilizes an augmented version of the input data as the dividend and the code generator word as the divisor. During each step of the division, the leading bit of the partial remainder is fed back to the numerous exclusive OR gates embedded within the shift register string. This conventional arrangement requires a significant number of exclusive OR circuits, particularly for code generator words that are densely distributed.

With the advent of high-speed magnetic bubble devices, it became inefficient to use a large number of exclusive OR gates and unduly complicated logic. Instead, a single exclusive OR gate was utilized in a serial encoding arrangement that was first described in a paper by the applicant. The paper, entitled "The Design and Embodiment of Magnetic Domain Encoders for Single-Error Correcting Decoders for Cyclic Block Codes," was published in the February, 1972 issue of the *Bell System Technical Journal* and represents the most pertinent prior art reference. The paper presents an encoder topology utilizing a single exclusive OR gate; however, the topology is specifically arranged for use with magnetic domain technology. The topology is dictated by a constraint imposed by the technology which requires all bits of information to be propagated by one period in one clock cycle. Thus, although magnetic domain technology offers inexpensive storage, this technology requires significant time intervals for every operation (generation, propagation, sensing, annihilation, and so forth) in contrast to the essentially instantaneous operation of semiconductor circuitry. Moreover, the ability of semiconductor shift registers to shift in at one rate and shift out at another rate is not utilized with such a topology.

In addition, the encoder topology presented in the paper is for the special case wherein the number of parity bits is sufficiently large compared to the number of data bits. To efficiently utilize channel capacity, it is desirable that the number of parity bits be small relative to the number of data bits. Neither applicant's paper nor other prior art teaches or suggests a serial encoding arrangement for efficient channel utilization.

The paper also discusses the binary division process utilized in a decoder. Besides elucidating a conventional decoder of the type wherein a series of exclusive OR gates is embedded in a shift register string, a specifically designed serial decoder adapted for use with the constraints of magnetic domain technology is presented. The aforementioned restrictions discussed with respect to magnetic domain encoders also apply with respect to decoders.

Furthermore, the paper only alluded to the need for a technique to synchronize the interaction of an encoder-decoder pair comprising a transmission system. No synchronizing plan was set forth for perusal.

SUMMARY OF THE INVENTION

These prior art restrictions, deficiencies and limitations are mitigated in accordance with the present invention of a synchronized, single error correcting data transmission system utilizing serial binary division for generating parity bits at the encoder and iteratively shifted versions of the syndrome at the decoder; error correcting information is obtained by serial comparison of the iteratively shifted versions of the syndrome with the characteristic word of the code.

Broadly speaking, the encoder comprises: generator word and data word shift registers as well as input and buffer shift registers; an exclusive OR circuit; and gating and clocking means. Shift-in to the registers occurs at the data word rate and a submultiple thereof; shift-out occurs at the code word rate. For the encoder to function properly whenever the number of parity bits is small, one of the buffer registers is partitioned into segments. These segmented registers have lengths that satisfy the data synchronism requirement as well as the shift register requirement that each of the storage means be shifting in or shifting out during predefined intervals within an encoding cycle.

The decoder comprises two substantially identical sections, each having two modes of operation. In the first mode, an incoming block of data is processed via serial division to obtain the syndrome. While one section is operating in the first mode, the other section operates in the second mode and processes the syndrome of the last received block to obtain shifted versions of the syndrome. Before evaluating each successively shifted version, a comparison with the fixed pattern of the characteristic is effected to determine if an error has occurred. The first mode operates at the data word rate and submultiples thereof whereas the second mode operates at the code word rate and submultiples thereof. Each decoder section comprises: generator word, characteristic word and syndrome shift registers as well as received word buffer registers; two exclusive OR circuits; and gating and clocking means. The sections alternate modes of operation so that two contiguous received blocks are being processed during any particular interval.

A number of distinct advantages and features accrue from the serial encoding and decoding transmission system. One major advantage is the ability of the system to utilize efficient block codes when the number of parity bits is small. Another advantage is that the number of exclusive OR gates is considerably reduced, especially for code generator words that are densely distributed. Yet another advantage is that the synchronization between (i) the bits in the data and code words at the encoder, and (ii) the bits in the received word and the corrected data word at the decoder, is easily achieved.

One feature is the ability to change the generator word from block-to-block to increase secrecy of transmission.

The organization and operation of this invention will be better understood from a consideration of the detailed description of the illustrative embodiments thereof, which follow, when taken in conjunction with the accompanying drawing.

DETAILED DESCRIPTION

Figure 1:
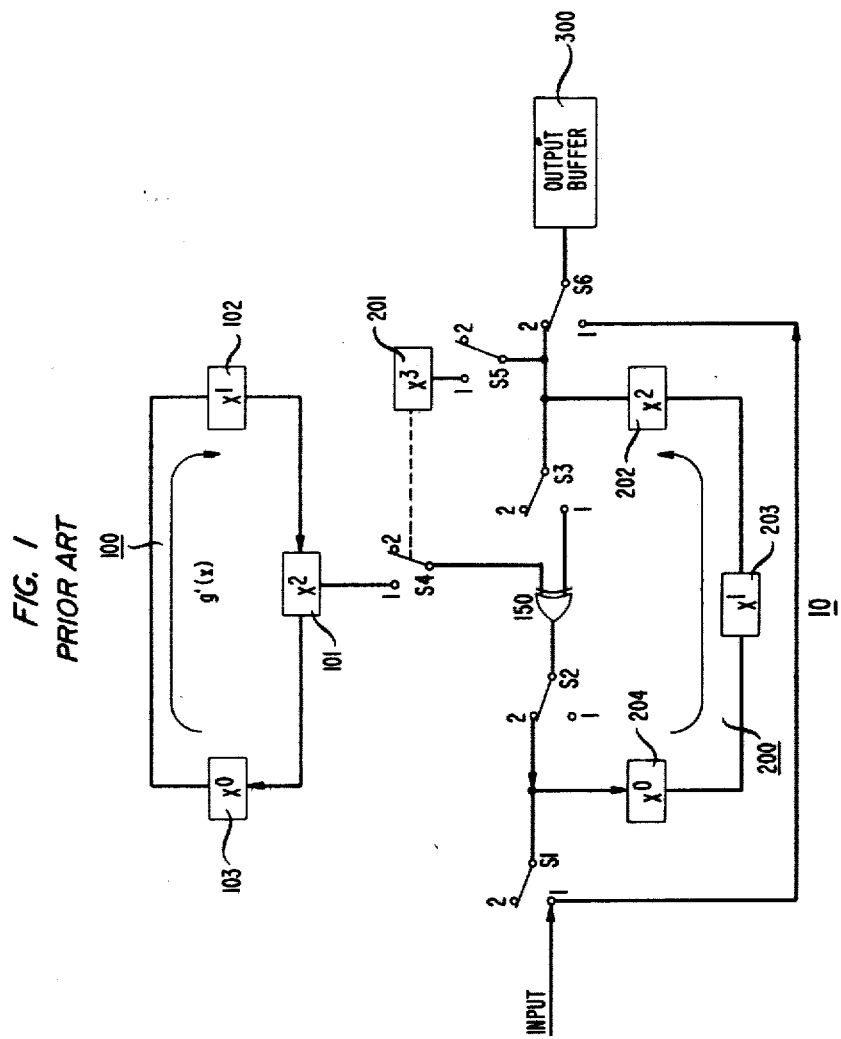
FIG. 1 is a circuit diagram of a prior art serial division processor exemplifying the process for a (7,4) Hamming code.

For clarity of exposition, it is helpful to provide a function theoretic basis to facilitate presentation of the illustrative embodiments. A (7,4) Hamming code, representing one particular code from the set of possible BCH codes, exemplifies function theoretic concepts. Also as an aid to illustrate the foundational concepts, the special encoder described by the applicant in the aforementioned paper is discussed. Descriptions of generalized illustrative embodiments of the present invention of an encoder, decoder and combination thereof follow the functional basis discussion.

1. Function Theoretic Basis

The primary purpose of this overview is to establish the terminology accompanying cyclic block codes and to define the mathematical manipulations associated with such codes. A more complete development of these concepts is presented in the text *Error-Correcting Codes* by W. W. Peterson, John Wiley and Sons, 1961.

Block codes constitute a set of codes in which a binary block of k-information bits has a binary block of $p = n - k$ parity bits appended to it, thereby constituting a (n,k) block code. The k-bit block is called the data word, the n-bit block the channel word and the p-bit block the parity check word. (It is worthwhile to note that the term "word" does not imply a fixed bit length. The length is variable depending on the context used; thus, for example, a data word has k bits whereas a channel word has n bits.)

It is convenient for manipulation purposes (as well as more esoteric mathematical purposes), to associate a polynomial with various code words. For instance, if a n-bit channel word has a bit stream given by 1010011, then the polynomial representation is $$c(X) = X^6 + X^4 + X^1 + X^0 = X^6 + X^4 + X + 1,$$

corresponding to unity in the first, third, sixth and seventh binary positions.

For each cyclic code there exists a polynomial g(X) which divides every channel word. This polynomial is called the generator of the code; it is of length (p+1) bits. The polynomial $g(X)$ is both irreducible and primitive in the field over which it is defined.

To understand how the division of code words by the generator polynomial proceeds, the c(X) above is divided by its generator $g(X) = X^3 + X + 1$ (1011):

```
                    X³ + 0 + 0  + 1
X³ + 0 + X + 1 / X⁶ + 0 + X⁴ + 0  + 0 + X + 1
                 X⁶ + 0 + X⁴ + X³
                  0 + 0  + X³ + 0
                  0 + 0  + 0  + 0
                       0 + X³ + 0 + X
                       0 + 0  + 0 + 0
                            X³ + 0 + X + 1
                            X³ + 0 + X + 1
                             0 + 0  + 0;
``` the remainder is three binary zeros, as postulated. In the division process, the "plus" symbol denotes the exclusive OR operation. With this convention defined, a short form polynomial division process may be accomplished using only bit manipulations; the above division has the form:

```
            1001
1011 / 1010011
       1011
       ----
        0010
        0000
        ----
         0101
         0000
         ----
          1011
          1011
          ----
           000.
```

In general, the first k bits of c(X) represent the data polynomial, designated d(X), and the last $p = n - k$ bits of c(X) represent the parity check polynomial, designated p(X). To obtain p(X) for each d(X), an augmented data polynomial, designated e(X), is formed from each d(X) by appending p zeros. For the c(X) given above, d(X) and e(X) are represented by the bit strings 1010 and 1010000, respectively; division of e(X) by g(X) yields 011 as a remainder, as anticipated.

Based on the above discussion, the general function of an encoder is to receive information d(X) in contiguous blocks from a data source and generate the channel word c(X) in blocks. Two subfunctions are: (i) forming the augmented data word e(X) and dividing it by the generator function g(X); and (ii) appending the remainder, p(X), to d(X), thereby forming c(X).

As the channel word c(X) is transmitted through the system, errors may randomly occur and change the received bit pattern. For a single error correcting system, the decoder recovers the original information (bits) of d(X). The received channel word is designated r(X). To detect and correct an error, the decoder first divides r(X) by g(X). The remainder, of length p bits, is called the syndrome, designated s(X). This syndrome is compared to the characteristic polynomial of the code, designated $\Gamma(X)$, which is obtained as the remainder upon division of $X^{n-1}$ by g(X). If the syndrome matches $\Gamma(X)$, an error has occured in the first bit position, that is, the one corresponding to $X^{n-1}$. If no match is achieved, the syndrome is shifted, that is, multiplied by X to yield $Xs(X)$. This shifted version is divided by g(X) and the remainder is compared to $\Gamma(X)$. A match indicates an error in the position corresponding to $X^{n-2}$.

No match causes another iteration of shift and divide. The shift, divide and match iterations proceed until a match is found, or in the case of no error, until a new received word r(X) is ready for processing.

To exemplify this discussion regarding decoder functions, the channel word c(X) above is assumed to be in error in the third binary position; thus, $r(X) = X^6 + X + 1$ (1000011). The characteristic word Γ(X) for the generator word 1011 is found from:

```
           1011
    1011 / 1000000
           1011
           ————
           0110
           0000
           ————
           1100
           1011
           ————
           1110
           1011
           ————
            101
``` or $\Gamma(X) = X^2 + 1$. Division of r(X) by g(X) yields:

```
           1011
    1011 / 1000011
           1011
           ————
           0110
           0000
           ————
           1101
           1011
           ————
           1101
           1011
           ————
            110
``` or $s(X) = X^2 + X$.

Since s(X) does not match Γ(X), the syndrome must be shifted and divided. A shorthand notation for this operation, as well as iterated versions thereof, is as follows:

$$g(X) = 1011 \overset{111..}{/ 1100} = Xs(X)$$

```
                    1011
                    ————
                    1110     = { remainder is 111; no match
                    1011         X²s(X) is 1110
                    ————
                    1010     = { remainder is 101; match
                                 X³s(X) is 1010
```

Since there is a match between the remainder of X²s(X) and Γ(X), the third bit position is corrected (inverted) and the first k bits, representing d(X), are extracted for postdetection processing by the decoder.

To demonstrate the division process in terms of a circuit arrangement, the topology of FIG. 1, representing an encoder for the (7,4) Hamming code, is considered. This topology represents a modified version of one set forth by the applicant in the above-mentioned paper.

The p least significant bits of g(X) (1011), denoted g'(X) (011), are stored in circulating shift register 100. Both before and after a circulation, register position 101 stores the highest order bit (0), register position 102 stores the next highest order bit (1) and register position 103 stores the remaining bit (1). Shift register 200 serves two purposes: (i) initially, register positions 201 through 204 receive and store the data word represented by d(X), with the highest order bit residing in position 201; and (ii) as the division process proceeds, register positions 201 through 204 store partial remainders, with the remainder after k (4) circulations representing the parity check word p(X). Switch S4 is designed to respond to the contents of register 201, closing only if the contents of register 201 are a logic one. The contents of shift registers 100 and 200, once initialized with g'(X) and d(X), respectively, are circulated in synchronism and compared in exclusive OR circuit 150. Register 100 is circulated clockwise whereas register 200 circulates counterclockwise. The circulation time is chosen so that computation of the parity check bits and transmission of the results to output buffer 300 are completed before the arrival of the first bit from the next data word.

The operation of encoder 10, after emptying its contents from the last full cycle, is as follows:

| Step 1 | Switch Position | S1 1 | S2 1 | S3 2 | S4 1 or 2 | S5 2 | S6 1 |
|---|---|---|---|---|---|---|---|

The first 3 bits (101) are shifted into register 200 and output buffer 300.

| Step 2 | Switch Position | S1 1 | S2 1 | S3 2 | S4 1 or 2 | S5 1 | S6 1 |
|---|---|---|---|---|---|---|---|

Shift register 200 is shifted once more so that the highest order data bit enters position 201 and the 4$^{th}$ bit of data (0) enters position 204 and output buffer 300 simultaneously.

| Step 3 | Switch Position | S1 2 | S2 2 | S3 1 | S4 1 | S5 2 | S6 1 |
|---|---|---|---|---|---|---|---|

Shift registers 100 and 200 are completely circulated once.

| Step 4 | Switch Position | S1 2 | S2 1 | S3 2 | S4 1 | S5 1 | S6 1 |
|---|---|---|---|---|---|---|---|

Shift register 200 is shifted once so that the bit in position 202 shifts to position 201 and a "0" bit enters position 204. Steps 3 and 4 are repeated 3 more times, each time using the contents of register position 201 to determine the setting of switch S4. The division is now complete.

| Step 5 | Switch Position | S1 2 | S2 1 | S3 1 | S4 1 or 2 | S5 2 | S6 2 |
|---|---|---|---|---|---|---|---|

The parity check bits are emptied into buffer 300. The process is repeated for the next data word by returning to step 1.

Figure 2:
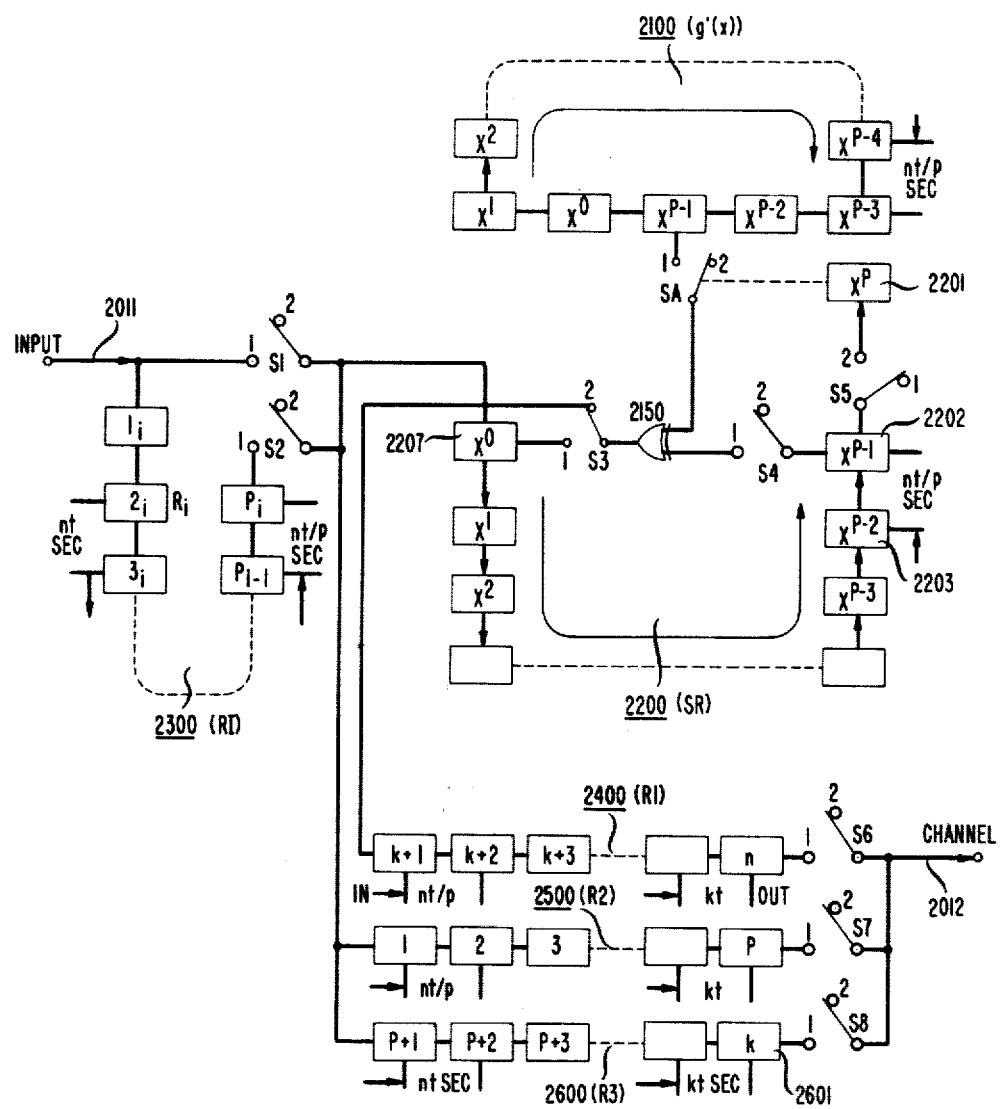
FIG. 2 is a circuit diagram of a prior art serial encoder for a general (n,k) block code having $p \geq 0.414k$.

A prior art serial encoder 10 for a generalized (n,k) block code with p≧0.414k is depicted in FIG. 2; this encoder embodies division circuitry similar to that of FIG. 1. In the circuit arrangement of FIG. 2, incoming bits of data arrive uniformly on lead 2011 every nt seconds and coded information is transmitted every kt seconds on lead 2012. Code information is partitioned and stored in shift registers 2400, 2500 and 2600. These registers are emptied every kt seconds through corresponding switches S6, S7 and S8, respectively; only one of these switches is closed at any given instant of time.

Shift register 2400 (R1) is of length p and stores the parity check bits. Shift register 2500 (R2) is also of length p and stores the first p bits of the present data word, designated d'(X) or d' (the $i^{th}$ bit is $d'_i$). Shift register 2600 (R3) is of length (k−p) and stores the bits of d'(X) starting with the (p+1) bit and ending with the bit in position k. Shift register 2300 (RI) is an interim store of length p and it collects the first p bits of each data word.

In operation, when register 2300 is full, its contents are moved, via switch S2 in position 1, to shift register 2200 (SR) and shift register 2500 within the nt interval preceding the arrival of the (p+1) data bit. The shift is synchronized with movement of the parity check bits of the last data word to register 2400 via switch 3 in position 2. Thus, shift-in bits propagate between register positions every nt seconds in register 2300 and every nt/p seconds in registers 2200 and 2500, whereas shift-out bits propagate between register positions every nt/p seconds in register 2300.

The arrival of the (p+1) bit of d'(X) is synchronized with the movement of the first bit of d'(X) from register position 2202 to position 2201 via switch S5 in position 2, of the second bit from position 2203 to position 2202, and so forth, until the (p+1) bit is entered into register position 2207 via switch S1 in position 1. The circulation of register 2200 for division by the contents of register 2100 (g'(X)) occurs for the next k number of nt intervals; the circulate propagation interval between register positions in both register 2100 and 2200 is nt/p seconds. The operation of switches SA, S4 and S5 is essentially identical to the operation of switches S4, S3 and S5 in FIG. 1.

The binary division process is synchronized with the arrival of bits (p+1) through k of data word d'(X). These (k-p) bits are stored in register 2600 via switch S1 and, as each bit arrives every nt seconds, it is entered into register position 2207. Moreover, during the division process, the data stored in register 2500, after a delay of (2n-k)kt seconds, is emptied, followed by a shifting-out of the contents of register 2600. The p parity bits residing in register 2200 are shifted to register 2400 during the nt interval preceeding the last shift-out operation of register 2600. Also, shift register 2300 is accumulating the p bits of the next data word d"(X) during this same nt interval.

The above cycle can be repeated indefinitely provided registers 2400, 2500 and 2600 can be emptied at the appropriate times.

Figure 3:
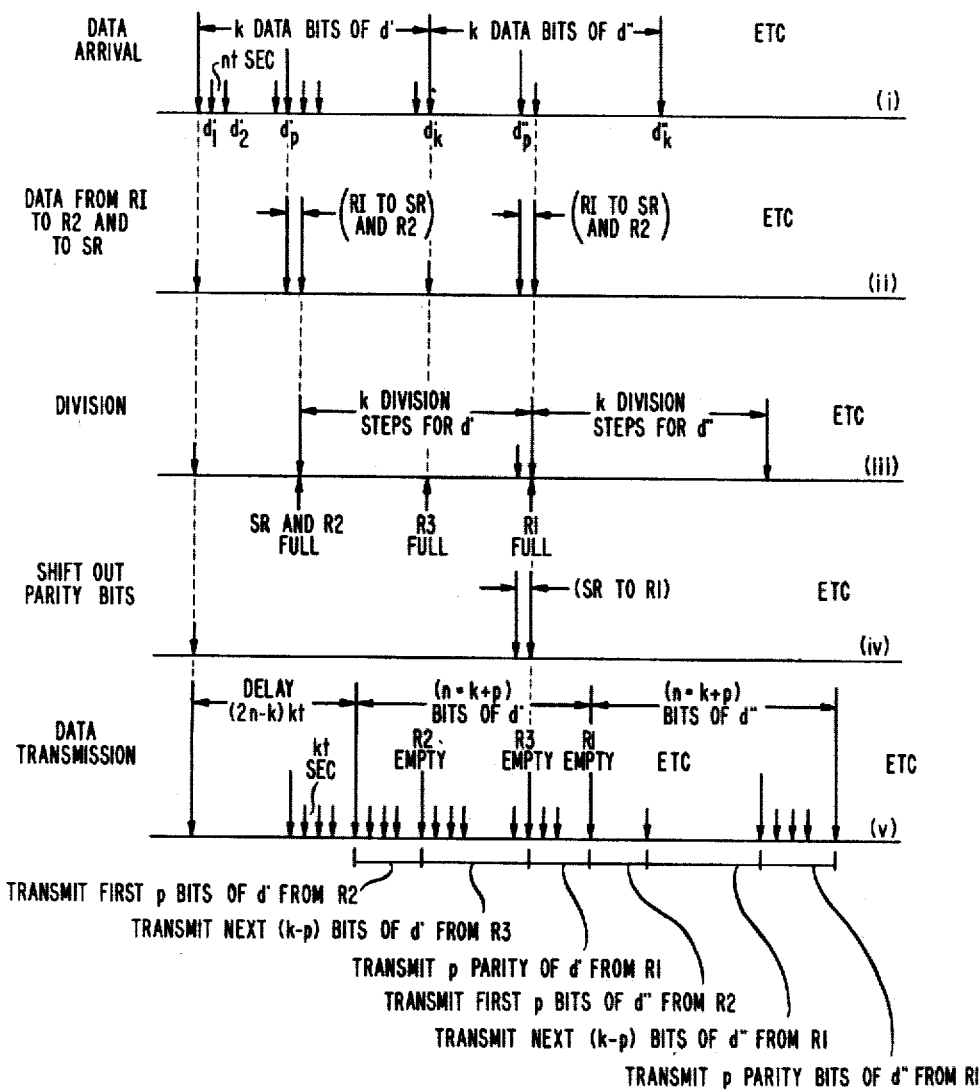
FIG. 3 is a timing diagram indicating the various processing intervals for the encoder shown in FIG. 2.

The operation of encoder 10 of FIG. 2 is summarized in the timing diagram of FIG. 3. Line (i) depicts the arrival intervals of data word d'(X) and d"(X). Line (ii) indicates the interval that bits are shifted from register 2300 to registers 2200 and 2500. Line (iii) shows the interval for which the binary division process is activated. Line (iv) indicates when the parity bits are shifted. Finally, line (v) indicates the shifting-out order of segmented code information from shift registers 2400, 2500 and 2600.

2. Encoder Illustrative Embodiments

A close examination of FIGS. 2 and 3 reveals that the arrangement of registers 2400, 2500 and 2600 is inadequate when p becomes a sufficiently small fraction of k; in particular, whenever $p > (\sqrt{2}-1)k$, the prior art encoder of FIG. 2 does not function. This situation arises because the p bits from register 2500 have all shifted out before the (p+1) bit propagates along register 2600 to register position 2601. Because register 2600 is still shifting in, it does not contain the proper bit pattern to begin its shift-out operation. Since most practical codes, in order to efficiently utilize channel capacity, require a small p, the condition of $p < (\sqrt{2}-1)k$ is generally a system design constraint.

Figure 5:
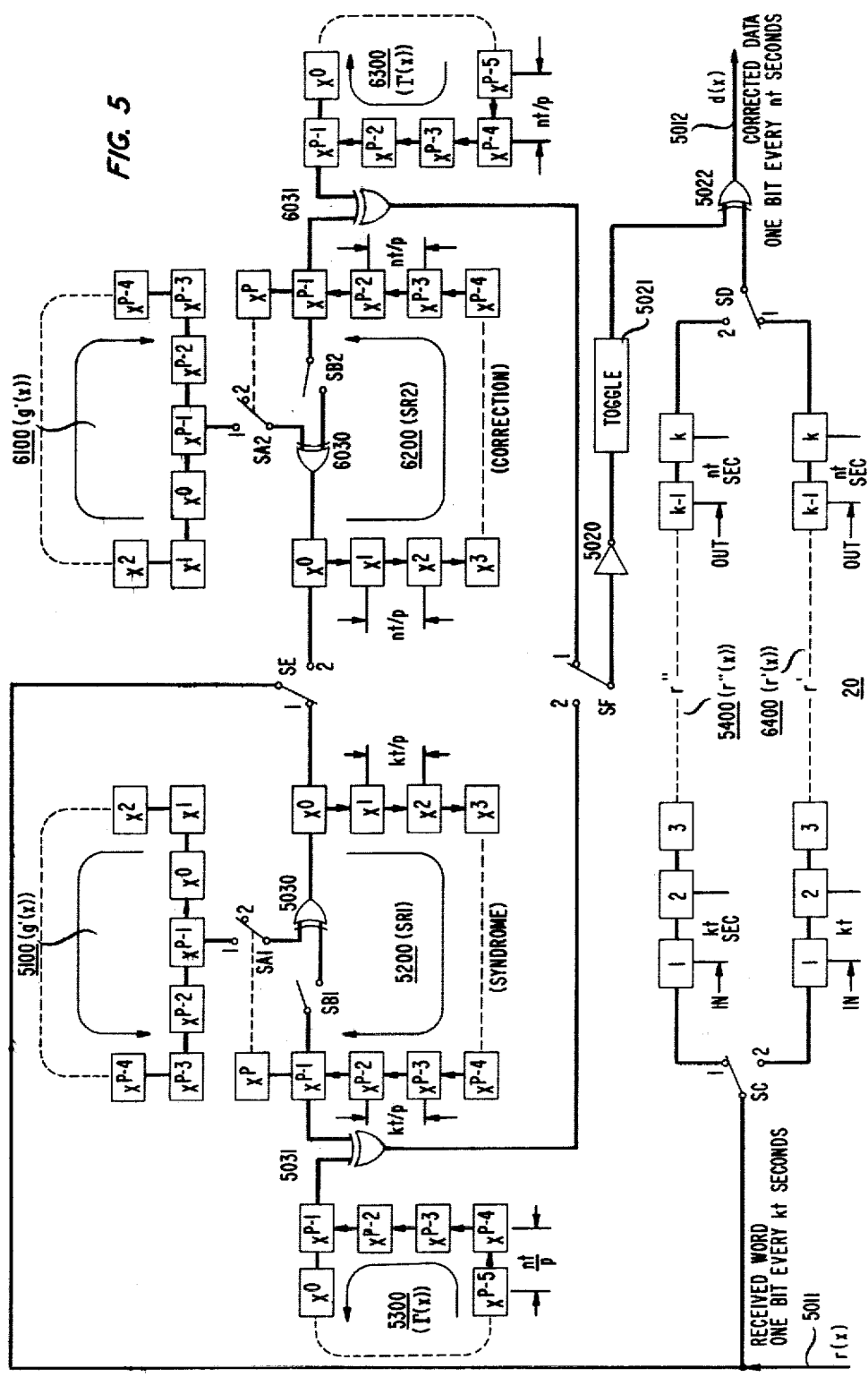
FIG. 5 is a circuit diagram depicting an illustrative embodiment in accordance with the present invention of a serial decoder for a general (n,k) block code.

An illustrative embodiment of an encoder in accordance with the present invention that circumvents the deficiency of the prior art is shown in FIG. 5. In this configuration, the register that stores bits (p+1) through k (register 2600 in FIG. 2) has been partitioned into segment registers 4600, 4700 and 4800. This new configuration satisfies the data synchronism requirement as well as the shift register stipulation that each of these stores be shifting in or shifting out during a predefined period within an encoding cycle.

In the preferred embodiment of encoder 12, there are generally two ways to partition the segments. The first arrangement sets all segment lengths to p except the last, the length of which is the difference between (k−p) bits and the bits allocated to the previous segments of length p. A second way is to arrange the segment lengths in proportion to a geometric progression.

To exemplify these principles, a (15,11) block code is considered. With this code, p=4 so that $p < (\sqrt{2}-1)k \approx 4.5$. Registers 4600, 4700 and 4800 are segmented to partition the 7 (k−p) bits required to be stored during the interval (p+1)(nt) through k(nt) in the following fashion: with the first arrangement, register 4600 is of length 4, register 4700 is of length 3 and register 4800 is not required; with the geometrical arrangement, register 4600 is of length 4, register 4700 is of length 2 and the last arriving bit is stored in register 4800.

With a (31,26) code, the first arrangement requires four segment registers of length 5 and one of length 1; the geometrical arrangement requires registers of length 1, 2, 4, 8 and 6, the last register accounting for bits unallocated to the geometric progression.

Figure 4:
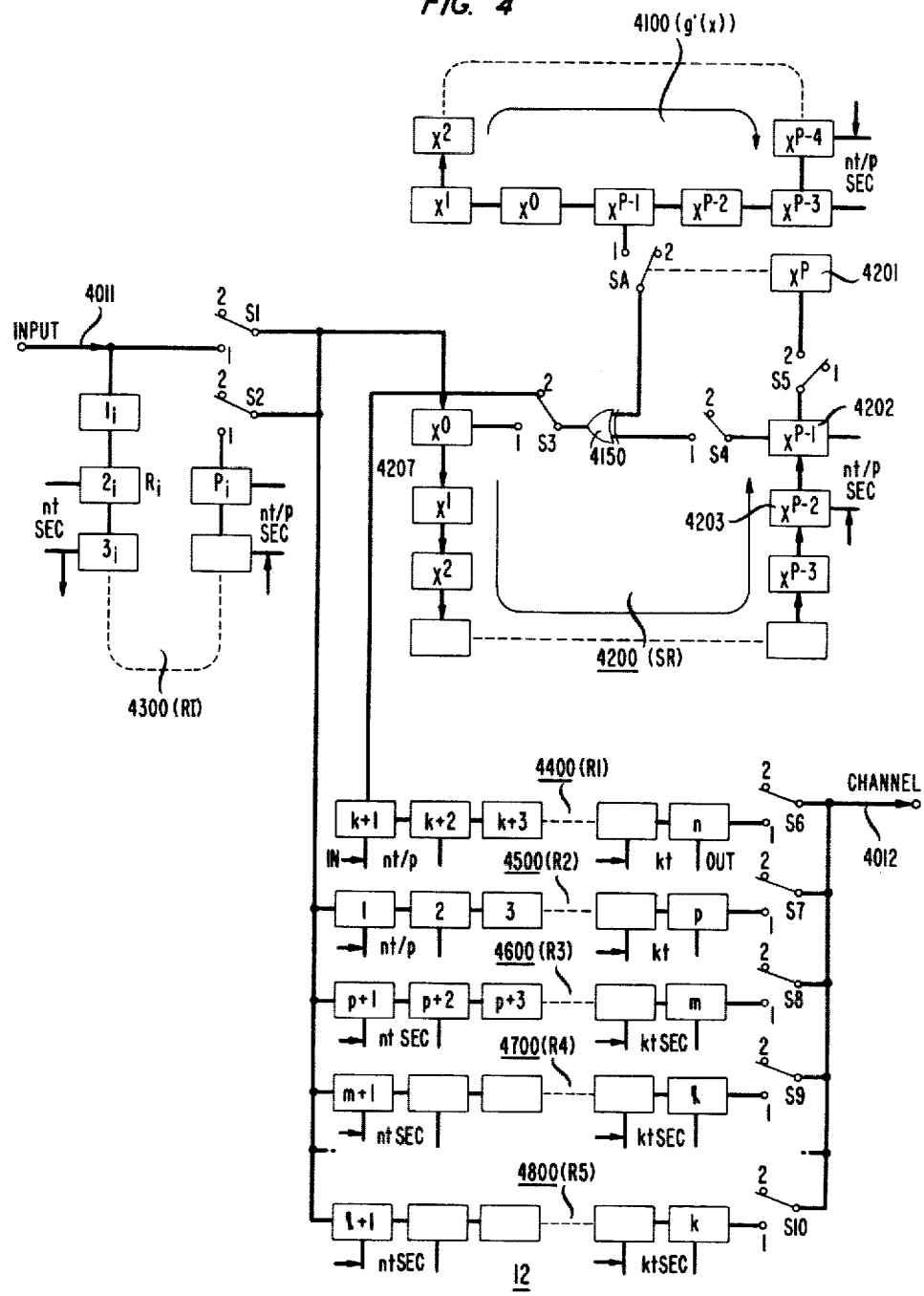
FIG. 4 is a circuit diagram depicting an illustrative embodiment in accordance with the present invention of a serial encoder for a general (n,k) block code having $p < 0.414k$.

The operation of all elements of FIG. 4, except register segments 4600, 4700 and 4800, has been described with reference to FIG. 2. (Indicia of FIG. 2 have been incremented by 2000 when referred to in FIG. 4). Regarding the operation of registers 4600, 4700 and 4800, shift-in occurs during the interval (p+1)(nt) through k(nt), and shift-out occurs during the interval (p+1)(kt) through k(kt). Specifically, register 4600 shifts in from (p+1)(nt) through m(nt), register 4700 is activated from (m+1)(nt) through l(nt), and so forth, until register 4800 shifts in from (l+1)(nt) through k(nt). The values, m, l, ..., are determined according to the equal distribution or geometric progression techniques. Switches S9 and S10 serve to synchronize the propagation of bits to channel 4012.

It is to be further understood that the encoder, and associated methodology, described herein is not limited to specific forms disclosed by way of example and illustration, but may assume other embodiments limited only by the scope of the appended claims.

3. Decoder Illustrative Embodiment

The circuit diagram depicted in FIG. 5 is an illustrative embodiment of a decoder implemented in accordance with the present invention. In gneneral, decoding comprises three distinct steps: (i) the calculation of the syndrome s(X) of received word r(X); (ii) shift and divide procedure of the syndrome s(X), that is, multiplication of s(X) by $X^l$, $l = 0, 1, \ldots, k-1$, followed by the division $X^l s(X)/g(X)$; and (iii) after each shift and divide, comparison of the partial remainder with the characteristic polynomial $\Gamma(X) = X^{n-1}/g(X)$.

Decoder 20 in FIG. 5 has two syndrome shift registers 5200 (SR1) and 2600 (SR2), both of length p. While register 5200 is processing one received word, designated r''(X) or r'' (bits are designated $r_i''$, i = 1, 2, ..., n) to determine its corresponding syndrome, register 6200 is shifting and dividing the syndrome of the previous received word r'(X).

Shift register 5100 (g'(X)), of length p, and register 5200, together with exclusive OR circuit 5030 and switches SA1 and SB1, comprise the basic serial divide circuitry. During syndrome computation, the serial divide circuitry circulates once every kt seconds, corresponding to a register position-to-register position propagate time of kt/p seconds. Shift register 5400 (r''(X)) stores the first k bits of r''(X) arriving on lead 5011 during the same interval the syndrome of r''(X) is being computed. Shift register 5300, of length p, stores the characteristic polynomial $\Gamma(X)$. When the decoder section associated with register 5300 operates in the shift and divide mode, the contents of register 5300 are compared bit-by-bit with the contents of register 5200 via exclusive OR circuit 5031. A circulation in the comparison mode occupies one nt period, corresponding to a register position-to-position propagate time of nt/p seconds. Operating in synchronism with the comparison circulation is the shifting-out operation of register 5400. If all p bits contained in register 5200 after the $l^{th}$ shift and divide operation match all p bits of $\Gamma(X)$, then the $l^{th}$ bit in r'(X) is complemented for error correction in exclusive OR gate 5022. The correction is accomplished with the aid of inverter 5020 and toggle circuit 5021. Each bit of the comparison is inverted by circuit 5020 and toggle 5021 provides a logic one output only if all p bits received in the nt interval corresponding to the $l^{th}$ data bit are logic one.

A structural and operational description similar to the one presented for the section corresponding to shift register 5200 applies for the other decoder section associated with register 6200. All indicia of the latter section are increased by 1000 over the indicia of the former section.

Data synchronization is achieved by switches SC, SD, Se and SF. These switches alternate between positions 1 and 2 for consecutive received words. The corrected data word appears on lead 5012, which is the output of exclusive OR gate 5022.

Figure 6:
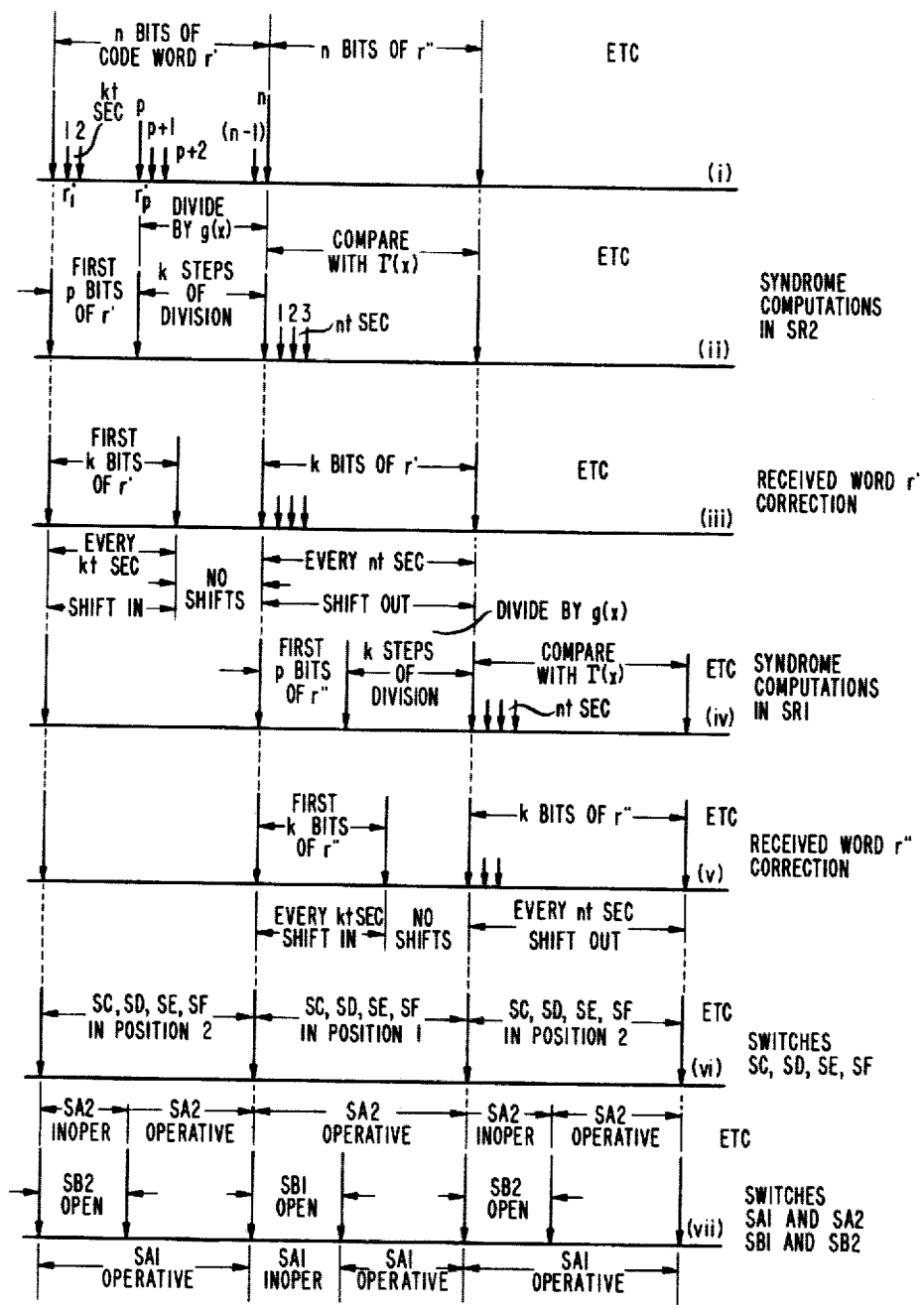
FIG. 6 is a timing diagram indicating the various processing intervals for the decoder of FIG. 5.

The timing diagram for decoder 20 of FIG. 5 is shown in FIG. 6. Line (i) indicates that the received words r'(X) and r''(X) arrive in blocks of n with kt seconds between each bit. Line (ii) shows that for the first p(kt) interval, received word bits $r_i'$ are loaded into register 6200. Upon arrival of the (p+1) bit, k steps of division are initiated and occur for the next k(kt) seconds. While r'' is being received and processed to determine its syndrome in register 5200 (line (iv)), comparison of the shifted and divided syndrome of r' is occurring. Line (iii) indicates that only the first k bits of r' are stored in register 6400, and this occurs at the input rate of kt seconds. Register 6400 is deactivated for the interval (n−k)kt through nkt seconds. Then register 6400 shifts out at the rate of one bit per nt seconds. Lines (iv) and (v) demonstrate that the same timing with respect to the complementary decoder section alternate with that depicted in lines (ii) and (iii). Line (vi) shows the settings of switches SC, SD, SE and SF to achieve proper synchronization. Finally, line (vii) indicates when the serial divide switches SA1, SB1 and SA2, SB2, associated with the first and second decoder sections, respectively, are activated.

It is to be further understood that the decoder, and associated methodology, described herein is not limited to specific forms disclosed by way of example and illustration, but may assume other embodiments limited only by the scope of the appended cliams.

I claim:

1. An encoder for generating a cyclically encoded n-bit channel word from an incoming k-bit data word, said encoder comprising serial shift and divide means for generating p parity bits, and wherein said encoder is further characterized by shift register means partitioned into a parallel arrangement of register segments of predetermined lengths for storing bits (p+1) through k of said data word in accordance with said predetermined lengths.

2. The encoder as recited in claim 1 wherein $p < (\sqrt{2}-1)k$ and a plurality of said predetermined lengths are substantially equal.

3. The encoder as recited in claim 1 wherein $p < (\sqrt{2}-1)k$ and a plurality of said predetermined lengths are proportional to a geometric progression.

4. A serial encoder for generating parity check bits to append to an incoming data word to form block coded channel word of length n bits having k data bits and p = n−k parity bits, said encoder comprising an input port for receiving said data word and an output port for transmitting said channel word, first circulating shift register means for storing the p least significant bits of the code generator polynomial, second circulating shift register means for storing a plurality of bits from said data word and sequentially shifted and divided versions of said data word, the last of said divided versions representing said parity check bits, indicator means for storing the output bit of said second shift register, an exclusive OR circuit, interim shift register means, coupled to said input port, for receiving and storing the first p bits from each said data word, first shift register buffer storage means of length p bits, second shift register buffer storage means of length p bits, third shift register buffer storage means of length (k−p) bits, first means for connecting the output of said interim shift register to the input of said second shift register and the input of said second buffer storage for transmission of the contents of said interim shift register during the time interval between bits p and (p+1), second means for connecting said input port to said input of said second shift register and the input of said third buffer storage for reception of bits (p+1) through k of said data word and for connecting said input of said second shift register to logic zero for p additional bits to form the augmented data word, third means for connecting the output of said exclusive OR circuit to the input of said first buffer storage during the interval of arrival of bits p and (p+1) and to said input of said second shift register otherwise, fourth means for connecting the output of said second shift register to said indicator means during each shift-in operation f bits (p+1) through n of said augmented data word, fifth means operating alternately with said fourth means for connecting, for connecting said output of said second shift register to one input of said exclusive OR circuit, sixth means, responsive to said indicator means, for connecting the other input of said exclusive OR circuit to the output of said first shift register or to logic zero whenever the bit in said indicator means is logic one or zero, respectively, and means for synchronously circulating the contents of said first and second shift registers between each arrival of bits (p+1) through n of said augmented data word for bit-by-bit comparison in said exclusive OR circuit.

wherein said encoder is further CHARACTERIZED BY said third shift register storage means partitioned into a parallel arrangement of register segments of predetermined lengths, means for shifting said (p+1) through k bits of said data word into said register segments according to said predetermined lengths, and means for sequentially shifting the contents of said second buffer storage, said register segments and said first buffer storage to said output port in time periods proportional to their respective lengths.

5. A decoder for error correcting a cyclically encoded received word, said decoder comprising means for storing said received word, means coupled to said storing means for serially shifting and dividing the contents of said storing means by the code generator polynomial to provide the syndrome of said received word as well as iteratively shifted versions of said syndrome, means, responsive to said means for shifting and dividing and operating after each shift and divide operation, for comparing the contents of said means for shifting and dividing with the characteristic polynomial of the code and means for correcting, in response to a predetermined output from said means for comparing, said received word in accordance with the number of iterations performed in generating said iteratively shifted versions of said syndrome.

6. A serial decoder for error correcting an incoming cyclically encoded data block, said decoder comprising means for storing the bits of said data block, first means coupled to said storing means for sequentially generating a bit-by-bit exclusive OR comparison between bits representative of the generator polynomial of the cyclic block code and the contents of said storing means to provide the syndrome of said data block and iteratively shifted versions of said syndrome, second means, operating alternately with said first means, for sequentially generating a bit-by-bit exclusive OR comparison between bits representative of the characteristic polynomial of the code and the contents of said first means, and means for correcting, in response to a predetermined output from said second means, the bit in said block corresponding to the number of iterations performed in generating said iteratively shifted versions of said syndrome.

7. A serial decoder for error correcting an incoming cyclically encoded block of length n bits having k data bits and $p = n - k$ parity check bits, said decoder comprising an input port for receiving said block, first circulating shift register means for storing the p least significant bits of the code generator polynomial, second circulating shift register means for storing a plurality of bits from said block as well as the syndrome and sequentially shifted and divided versions of said syndrome, indicator means for storing the output bit from said second shift register, a first exclusive OR circuit having its output connected to the input of said second shift register, first means for connecting said input of said second shift register to said input port for reception of bits one through n of said block and to logic zero for reception of p additional bits, second means for connecting the output of said second shift register to one input of said first exclusive OR circuit except during each operation of shifting in a bit as provided by said first means for connecting, third means, responsive to said indicator means, for connecting the other input of said first exclusive OR circuit to the output of said first shift register or to logic zero whenever the bit in said indicator means is a logic one or zero, respectively, and first means for synchronously circulating the contents of said first and second shift registers between each arrival of bits (p+1) through n of said block and said p additional bits for bit-by-bit comparison in said first exclusive OR circuit, wherein said decoder is further CHARACTERIZED BY third circulating shift register means for storing the p bits representing the characteristic polynomial of said code, a second exclusive OR circuit responsive to the output of said second shift register and the output of said third shift register second means, operating simultaneously with said first means for circulating during circulation of said p additional bits, for synchronously circulating the contents of said second shift register and said third shift register for bit-by-bit comparison in said second exclusive OR circuit, means, coupled to said input port and responsive to the output of said second exclusive OR circuit, for inverting the bit in said block corresponding to the number of circulations of said second means for circulating whenever said output of said exclusive OR circuit is p bits of logic zero.

8. Serial decoder means for decoding an incoming cyclically encoded block of length n bits having k data bits and $p = n - k$ parity check bits, said decoder comprising first circulating shift register means for storing the p least significant bits of the code generator polynomial g(X), second circulating shift register means for storing a plurality of bits from said block as well as the syndrome s(X) and sequentially shifted and divided versions $X^l s(X)$, the index $l=0, 1, 2, \ldots, k-1$, of said syndrome, indicator means for storing the output bit from said second shift register, a first AND circuit responsive to said indicator means and the output of said first shift register means, gating means for circulating the contents of said first shift register and said second shift register in bit-by-bit synchronism, a second AND circuit responsive to the output of said second shift register and said gating means, a first exclusive OR circuit responsive to said first AND circuit and said second AND circuit, the output of said first exclusive OR circuit serving as the input to said second shift register during the operation of said gating means, and means for shifting the contents of said second shift register, including means for providing p additional bits of logic zero the the input of said second shift register after reception of the n bits of said block, wherein said decoder is further CHARACTERIZED BY means for error correcting comprising third circulating shift register means for storing the p bits representing the characteristic polynomial $\Gamma(X)$ of said code, a second exclusive OR circuit responsive to said output of said second shift register and the output of said third shift register, comparison means for synchronously circulating the contents of said second shift register and said third shift register for bit-by-bit comparison in said second exclusive OR circuit, means, responsive to the output of said second exclusive OR circuit, for inverting the bit in said block corresponding to said index l whenever the output of said second exclusive OR circuit is p bits of logic zero, and means for sequentially operating said comparison means, said means for shifting and said means for gating.

9. Circuitry for decoding and error correcting (p+k, k) cyclically encoded blocks of incoming data, said circuitry comprising two substantially identical sections with each of said sections having a syndrome mode and a correction mode of operation and comprising first and second exclusive OR circuits, first shift register means for receiving and storing the first k bits from one of said blocks, second shift register means for storing and circulating the bits of the generator polynomial of the code, third shift register means for storing and circulating the p bits representative of the characteristic polynomial of said code, and fourth shift register means of length (p+1) for receiving and processing said one of said blocks, wherein for operation in said syndrome mode, said each of said sections further includes first means for connecting the outputs of said second and forth shift registers to the inputs of said first exclusive OR circuit and the output of said first exclusive OR circuit to the input of said fourth shift register, and second means for shifting into said fourth shift register each bit from said one of said blocks upon reception and then, after reception of each bit (p+1) through k, circulating the contents of said second shift register for bit-by-bit comparison with the contents of said fourth shift register in said first exclusive OR circuit to generate the syndrome of said incoming data, wherein for operation in said correction mode, said each of said sections further includes third means for connecting the output of said third shift register and the output from the pth bit position of said fourth shift register to said second exclusive OR circuit, fourth means for shifting into said fourth shift register p bits of logic zero and then, after each shift in of said logic zero bit, circulating the contents of said third shift register for bit-by-bit comparison with the contents of said fourth shift register in said second exclusive OR circuit to generate iteratively shifted versions of said syndrome, and fifth means, interconnecting the output of said second exclusive OR circuit with the input of said first shift register, for correcting an error in said one of said blocks in response to a predetermined output from said second exclusive OR circuit and in accordance with the number of iterations performed in generating said iteratively shifted versions of said syndrome.

10. In combination, an encoder for generating a cyclically encoded n-bit channel word from an incoming k-bit data word, and a decoder for error correcting the received word representative of said channel word, said encoder comprising serial shift and divide means for generating p parity check bits, and shift register means partitioned into a parallel arrangement of register segments of predetermined lengths, for storing said parity bits and for storing bits (p+1) through k of said data word in accordance with said predetermined lengths; and said decoder comprising means for storing said received word, means coupled to said storing means for serially shifting and dividing the contents of said storing means by the code generator polynomial to provide the syndrome as well as iteratively shifted versions of said syndrome, means, responsive to said means for serially shifting and dividing and operating after each shift and divide operation, for comparing the contents of said means for shifting and dividing with the characteristic polynomial of the code, and means for correcting, in response to a predetermined output from said means for comparing, said received word in accordance with the number of iterations performed in generating said iteratively shifted versions of said syndrome.

11. The combination as recited in claim 10 wherein $p < (\sqrt{2}-1)k$ and a plurality of said predetermined lengths are substantially equal.

12. The combination as recited in claim 10 wherein $p < (\sqrt{2}-1)k$ and a plurality of said predetermined lengths are proportional to a geometric progression.

13. The combination as recited in claim 11 or claim 12 wherein said serial shift and divided means includes first means for sequentially generating a bit-by-bit exclusive OR comparison between bits representative of the generator polynomial $g(X)$ of said code and the augmented data polynomial $e(X)$, and said means for serially shifting and dividing includes second means for sequentially generating a bit-by-bit exclusive OR comparison between bits representative of said generator polynomial g(X) and said shifted and divided versions of said syndrome.

14. A method for encoding an incoming data word of length k to generate a cyclically encoded channel word of length n comprising the steps of:

serially shifting and dividing said data word by the code generator word to obtain the parity word of length p;

partitioning output buffer means into a parallel arrangement of a parity register of length p and a plurality of register segments having predetermined lengths totalling (k−p) register positions;

storing the (k−p) least significant bits of said data word upon arrival in said register segments of predetermined length and said parity word in said parity register; and sequentially gating the contents of said register segments and said parity register to form at least a portion of said channel word.

15. A method for decoding a cyclically encoded received word having k data positions to correct a single error comprising the steps of:

(i) serially shifting and dividing said received word by the code generator word to obtain the syndrome of said received word;

(ii) storing said syndrome in a circulating register;

(iii) comparing the contents of said circulating register with the code characteristic word to generate error detection information;

(iv) proceeding to step (v) when no error is detected in step (iii), or to step (vi) when an error is detected in step (iii), or to step (vii) upon k iterations of step (iii);

(v) serially shifting and dividing said contents of said register by said generator word, storing the result in said register and repeating step (iii);

(vi) correcting said error in said received word in accordance with the number of iterations of step (iii) and then proceeding to step (vii); and (vii) repeating the above steps for contiguously received blocks of data, each block comprising one said received word.

* * * * *